US008592691B2

(12) United States Patent
Furuta et al.

(10) Patent No.: US 8,592,691 B2
(45) Date of Patent: Nov. 26, 2013

(54) PRINTED WIRING BOARD

(75) Inventors: Toru Furuta, Ogaki (JP); Kotaro Takagi, Ogaki (JP); Michio Ido, Ogaki (JP); Akihiro Miyata, Ogaki (JP); Fumitaka Takagi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 123 days.

(21) Appl. No.: 12/685,731

(22) Filed: Jan. 12, 2010

(65) Prior Publication Data

US 2010/0218983 A1 Sep. 2, 2010

Related U.S. Application Data

(60) Provisional application No. 61/156,114, filed on Feb. 27, 2009.

(51) Int. Cl.
*H05K 1/11* (2006.01)

(52) U.S. Cl.
USPC ........... 174/262; 174/250; 174/255; 174/256; 174/257; 174/258; 174/260; 174/261; 174/264; 174/265; 174/266; 361/761; 361/764; 361/767; 361/794; 257/670; 257/676; 257/697; 257/700; 257/774; 385/14; 385/94; 385/146; 438/612; 438/638; 438/672; 29/831; 29/846; 29/847; 29/852

(58) Field of Classification Search
USPC .......... 174/250, 255–258, 260–266; 361/761, 361/764, 767, 794; 385/14, 94, 146; 257/670, 676, 697, 700, 774; 438/612, 438/638, 672; 29/831, 846, 847, 852
See application file for complete search history.

(56) References Cited

U.S. PATENT DOCUMENTS

| 5,445,311 | A   | * | 8/1995  | Trask et al. ................... 228/175 |
| 6,683,468 | B1  | * | 1/2004  | Brophy et al. ............ 324/756.02 |
| 6,998,336 | B1  | * | 2/2006  | Iba et al. ..................... 438/612 |
| 7,230,188 | B1  | * | 6/2007  | En et al. ...................... 174/257 |
| 7,827,680 | B2  | * | 11/2010 | En et al. ........................ 29/831 |
| 7,902,659 | B2  | * | 3/2011  | Hirose et al. ................. 257/697 |

(Continued)

FOREIGN PATENT DOCUMENTS

JP         2000-357851        12/2000

OTHER PUBLICATIONS

U.S. Appl. No. 12/491,282, filed Jun. 25, 2009, Furuta, et al.
U.S. Appl. No. 12/685,716, filed Jan. 12, 2010, Furuta, et al.

(Continued)

*Primary Examiner* — Xiaoliang Chen
(74) *Attorney, Agent, or Firm* — Oblon, Spivak, McClelland, Maier & Neustadt, L.L.P.

(57) ABSTRACT

A method for manufacturing a printed wiring board includes forming a metal film on a surface of an insulative board, a plating resist on the metal film, and a plated-metal film on the metal film exposed from the plating resist, covering a portion of the plated-metal film with an etching resist, etching to reduce thickness of the plated-metal film exposed from the etching resist, removing the etching and plating resists, and forming a wiring having a pad for wire-bonding an electrode of an electronic component and a conductive circuit thinner than the pad by removing the metal film exposed after the plating resist is removed, a solder-resist layer on the surface of the board and wiring, an opening in the layer exposing the pad and a portion of the circuit contiguous to the pad, and a metal coating on the pad and portion of the circuit exposed through the opening.

7 Claims, 19 Drawing Sheets

(56) References Cited

U.S. PATENT DOCUMENTS

| | | | |
|---|---|---|---|
| 8,035,214 B1* | 10/2011 | Hirose et al. | 257/697 |
| 2002/0119595 A1* | 8/2002 | Kim et al. | 438/106 |
| 2003/0014863 A1* | 1/2003 | Lee et al. | 29/847 |
| 2003/0168255 A1* | 9/2003 | Kim et al. | 174/261 |
| 2003/0178229 A1* | 9/2003 | Toyoda et al. | 174/261 |
| 2004/0209395 A1* | 10/2004 | Yang et al. | 438/106 |
| 2004/0227239 A1* | 11/2004 | Murata et al. | 257/738 |
| 2005/0037601 A1* | 2/2005 | Hsu et al. | 438/612 |
| 2005/0158553 A1* | 7/2005 | Hirose et al. | 428/411.1 |
| 2005/0185880 A1* | 8/2005 | Asai | 385/14 |
| 2005/0258522 A1* | 11/2005 | En et al. | 257/670 |
| 2006/0157865 A1* | 7/2006 | Hokari | 257/774 |
| 2006/0225918 A1* | 10/2006 | Chinda et al. | 174/260 |
| 2006/0226544 A1* | 10/2006 | Hsu et al. | 257/737 |
| 2006/0237225 A1* | 10/2006 | Kariya et al. | 174/260 |
| 2006/0263003 A1* | 11/2006 | Asai et al. | 385/14 |
| 2007/0095466 A1* | 5/2007 | Tsuda | 156/272.2 |
| 2007/0205520 A1* | 9/2007 | Chou et al. | 257/780 |
| 2007/0281471 A1* | 12/2007 | Hurwitz et al. | 438/638 |
| 2008/0066954 A1* | 3/2008 | Jeon et al. | 174/261 |
| 2008/0093109 A1* | 4/2008 | Hsu et al. | 174/250 |
| 2008/0170819 A1* | 7/2008 | Kodama et al. | 385/14 |
| 2008/0190658 A1* | 8/2008 | Toyoda et al. | 174/263 |
| 2008/0264681 A1* | 10/2008 | Iwai et al. | 174/257 |
| 2009/0027864 A1* | 1/2009 | Cho et al. | 361/767 |
| 2009/0052150 A1* | 2/2009 | Kobayashi | 361/767 |
| 2009/0078451 A1* | 3/2009 | Niki et al. | 174/250 |
| 2009/0154131 A1* | 6/2009 | Hirose et al. | 361/803 |
| 2009/0174045 A1* | 7/2009 | Arvin et al. | 257/676 |
| 2009/0178830 A1* | 7/2009 | Seo et al. | 174/257 |

OTHER PUBLICATIONS

U.S. Appl. No. 12/582,050, filed Oct. 20, 2009, Furuta, et al.

* cited by examiner (A)

(B)

(C)

(D)

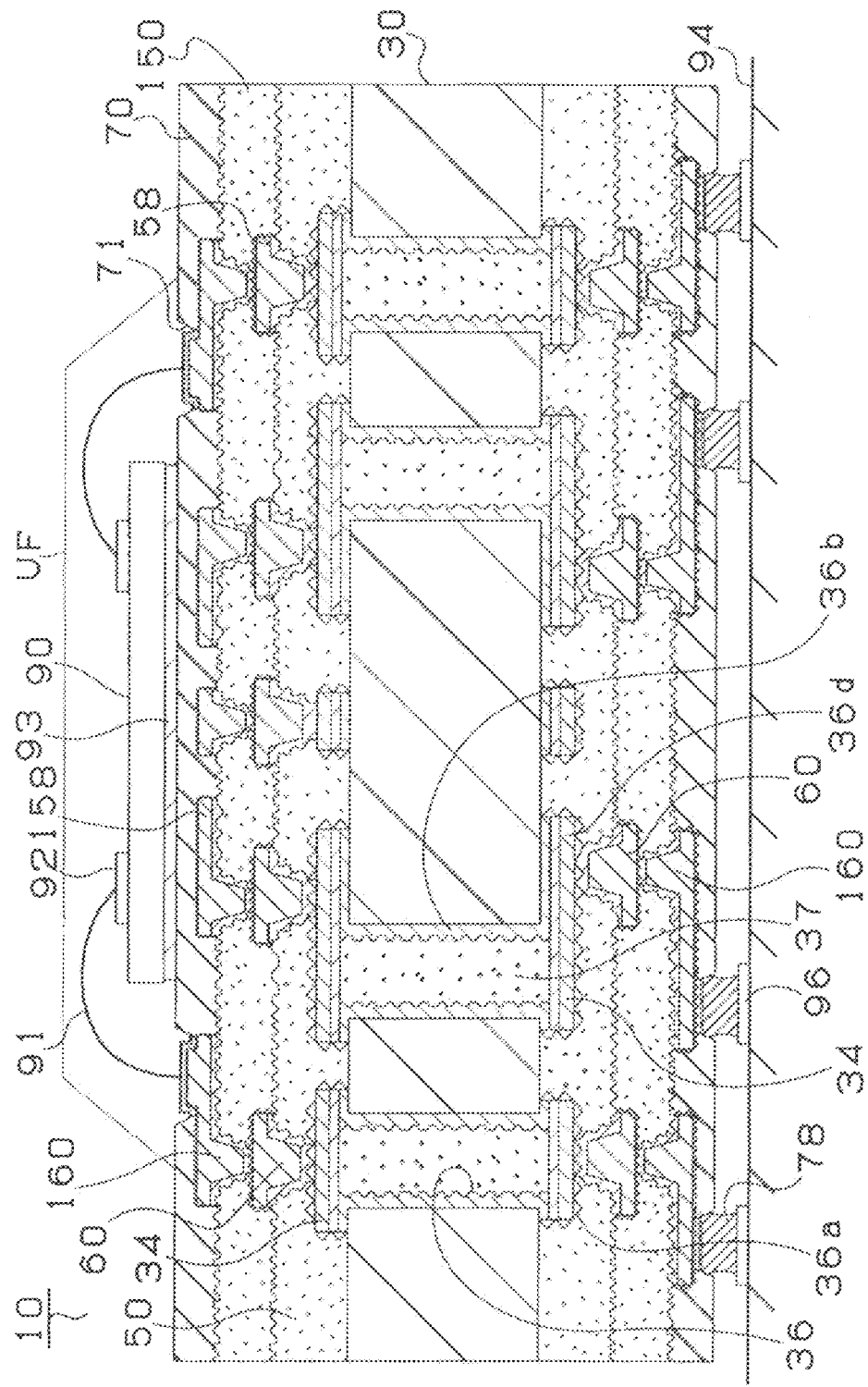

PRINTED WIRING BOARD

CROSS-REFERENCE TO RELATED APPLICATIONS

The present application claims the benefits of priority to U.S. Application No. 61/156,114, filed Feb. 27, 2009. The contents of that application are incorporated herein by reference in their entirety.

BACKGROUND OF THE INVENTION

1. Field of the Invention

The present invention is related to a printed wiring board on which to mount an electronic component such as an IC chip; especially to a printed wiring board having a pad for wire bonding.

2. Discussion of the Background

In Japanese Laid-Open Patent Publication 2000-357851, the content of which are incorporated herein by reference in their entirety, a circuit board for wire bonding is described: Namely, in such a circuit board, an insulation layer is formed in an area for mounting a semiconductor chip, and a wiring pattern, which electrically connects the semiconductor chip to a bonding electrode on the circuit board, is formed to be distributed inside the area for mounting the semiconductor chip where the insulation layer is formed; accordingly, highly integrated wiring and high-density mounting are achieved in such a circuit board.

SUMMARY OF THE INVENTION

A method for manufacturing a printed wiring board according to one aspect of the present invention is as follows: preparing an insulative board; forming a metal film on a surface of the insulative board; forming a plating resist on the metal film; forming a plated-metal film on the metal film left exposed by the plating resist; covering a portion of the plated-metal film with an etching resist; etching to reduce the thickness of the plated-metal film exposed from the etching resist; removing the etching resist; removing the plating resist; by removing the metal film exposed after the plating resist is removed, forming wiring made up of a pad to be wire-bonded with an electrode of an electronic component and of a conductive circuit which is thinner than the pad; forming a solder-resist layer on the surface of the insulative board and the wiring; forming an opening in the solder-resist layer to expose the pad and portion of the conductive circuit contiguous to the pad; and forming a metal coating on the pad and portion of the conductive circuit which are exposed through the opening.

A method for manufacturing a printed wiring board according to another aspect of the present invention is as follows: preparing an insulative board; forming a metal film on a surface of the insulative board; covering a portion of the metal film with a first plating resist; forming a first plated-metal film on the metal film exposed from the first plating resist; covering a portion of the first plated-metal film with a second plating resist; forming a second plated-metal film on the first plated-metal film exposed from the second plating resist; removing the first and second plating resists; by removing the metal film left exposed by the first and second plated-metal films, forming wiring made up of a pad to be wire-bonded with an electrode of an electronic component and of a conductive circuit which is thinner than the pad; forming a solder-resist layer on the surface of the insulative board and the wiring; forming an opening in the solder-resist layer to expose the pad and a portion of the conductive circuit contiguous to the pad; and forming a metal coating on the pad.

A printed wiring board according to yet another aspect of the present invention has an insulative board; a wiring formed on a surface of the insulative board and made up of a pad to be wire-bonded with an electrode of an electronic component and of a conductive circuit contiguous to the pad; and a metal coating formed on the pad. In such a printed wiring board, the thickness of the pad is greater than the thickness of the conductive circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 19 is a cross-sectional view showing a state in which an IC chip is mounted on a multilayer printed wiring board according to the first embodiment.

DETAILED DESCRIPTION OF THE EMBODIMENTS

Figure 1:
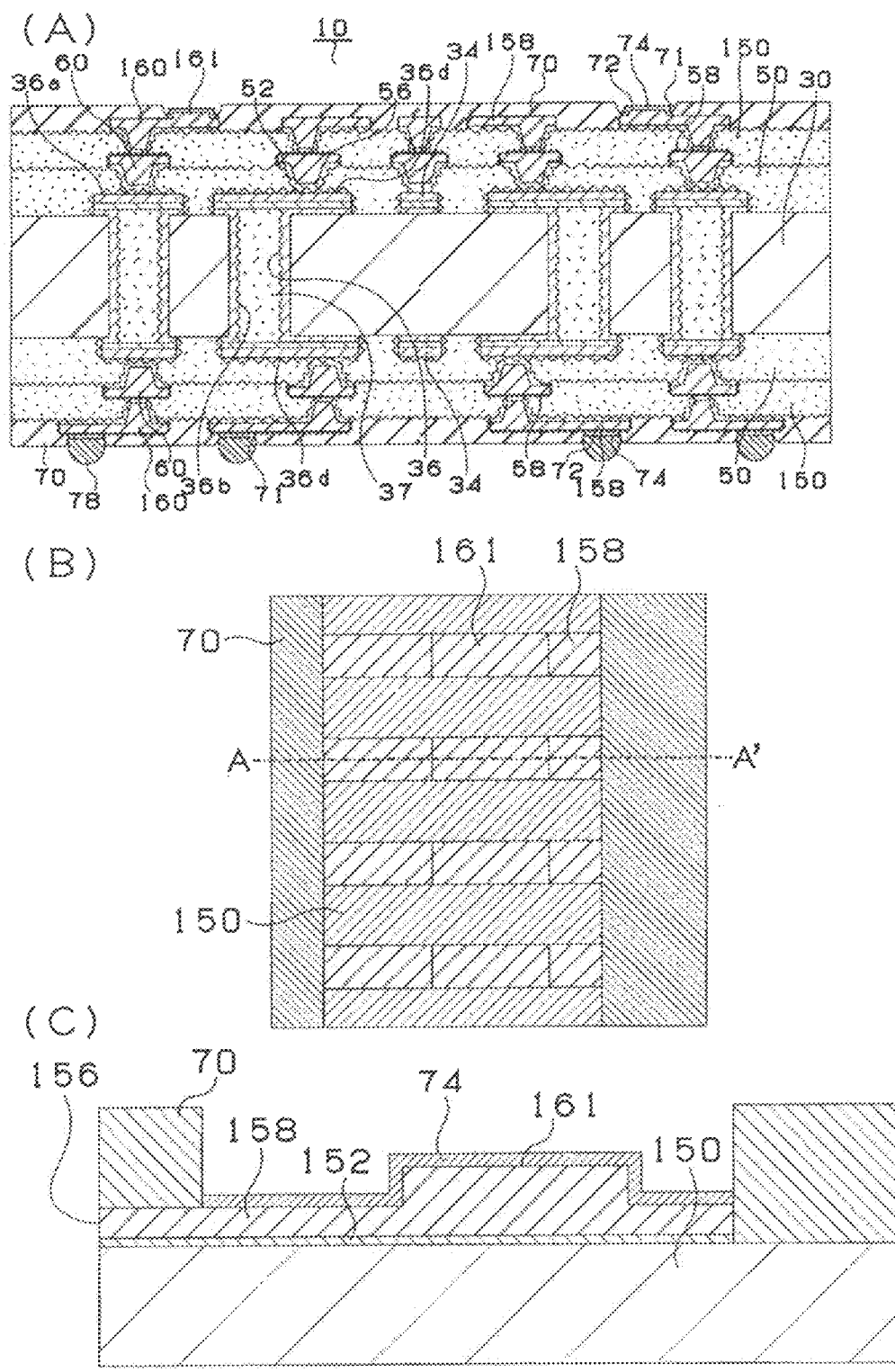
FIG. 1 are cross-sectional views and a top view of a multilayer printed wiring board according to an embodiment of the present invention.

The embodiments will now be described with reference to the accompanying drawings, wherein like reference numerals designate corresponding or identical elements throughout the various drawings.

EMBODIMENTS

First Embodiment

The structure of a printed wiring board according to an embodiment of the present invention is described with reference to FIGS. 1A-1C. FIG. 1A is a cross-sectional view showing multilayer printed wiring board 10. In multilayer printed wiring board 10, conductive circuits 34 are formed on the surfaces of core substrate 30. The front and back surfaces of core substrate 30 are connected by means of through-holes 36. Through-holes 36 are made up of plated cover layers (36a, 36d) which form through-hole lands and of side-wall conductive layers (36b). In the interiors surrounded by side-wall conductive layers (36b), resin filler 37 is filled. Resin insulation layers 50 having filled vias 60 and conductive circuits 58 and resin insulation layers 150 having filled vias 160 and conductive circuits 158 are formed on plated cover layers (through-hole lands) (36a, 36d). Pads 161 are formed at predetermined spots of upper-side conductive circuits 158. Solder resist layers 70 are formed on resin insulation layers 150. Part of conductive circuits 158 and pads 161 are exposed through opening portions 71 of upper-side solder resist layer 70; and bumps 78 are formed in lower-side opening portions 71.

FIG. 1B is a magnified top view showing part of multilayer printed wiring board 10. FIG. 1C is a cross-sectional view seen from the (A-A') line in FIG. 1B. The thickness of pad 161 is set to be greater than the thickness of conductive circuit 158, preferably approximately 2-10 µm thicker. Pad 161 is used for wire-bonding the multilayer printed wiring board and a terminal of an electronic component such as a semiconductor chip. Metal coating 74 such as Au is coated on the pad surface according to requirements.

Figure 2:
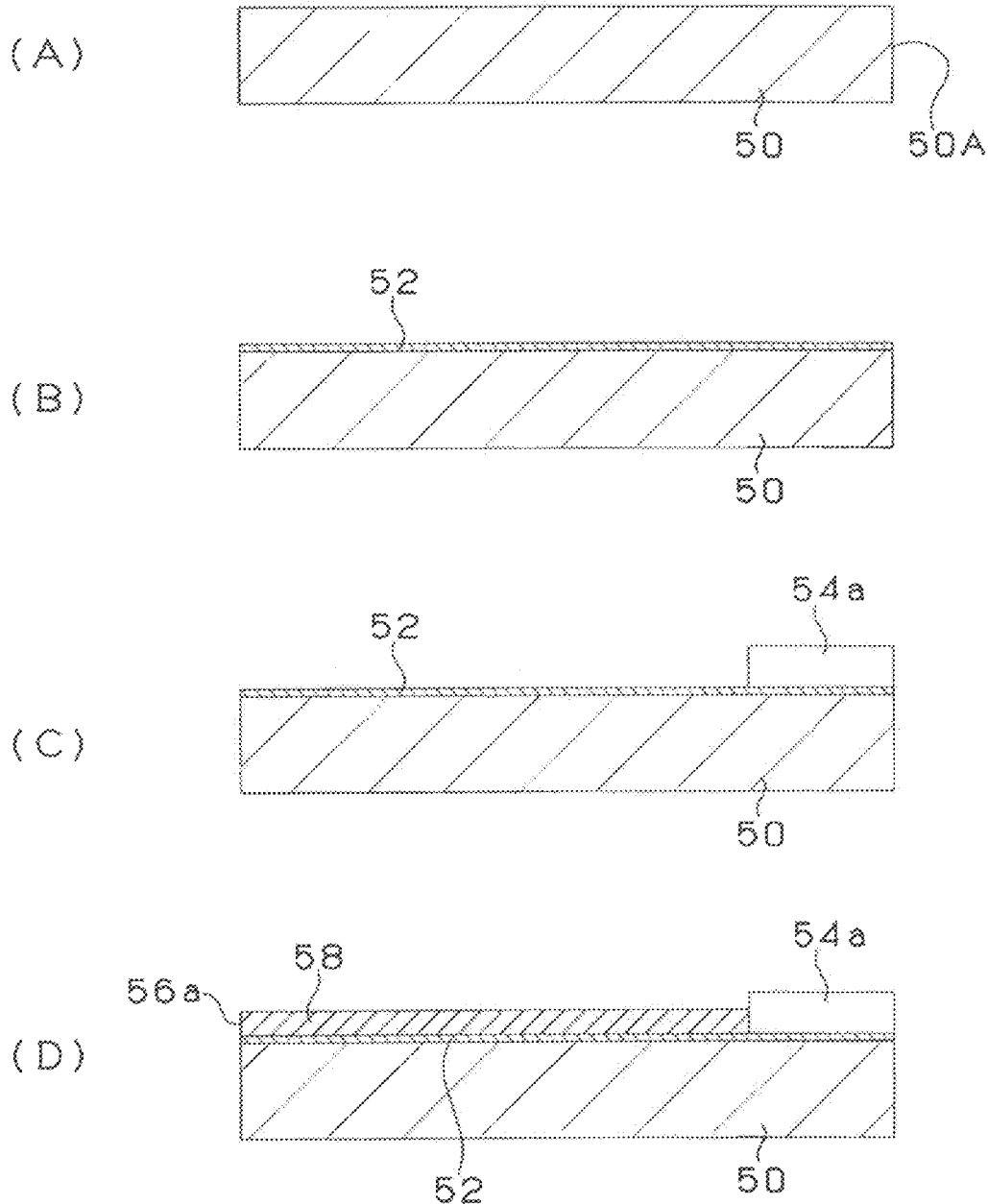
FIG. 2 are views showing the steps of a method for manufacturing a printed wiring board according to the first embodiment.
Figure 3:
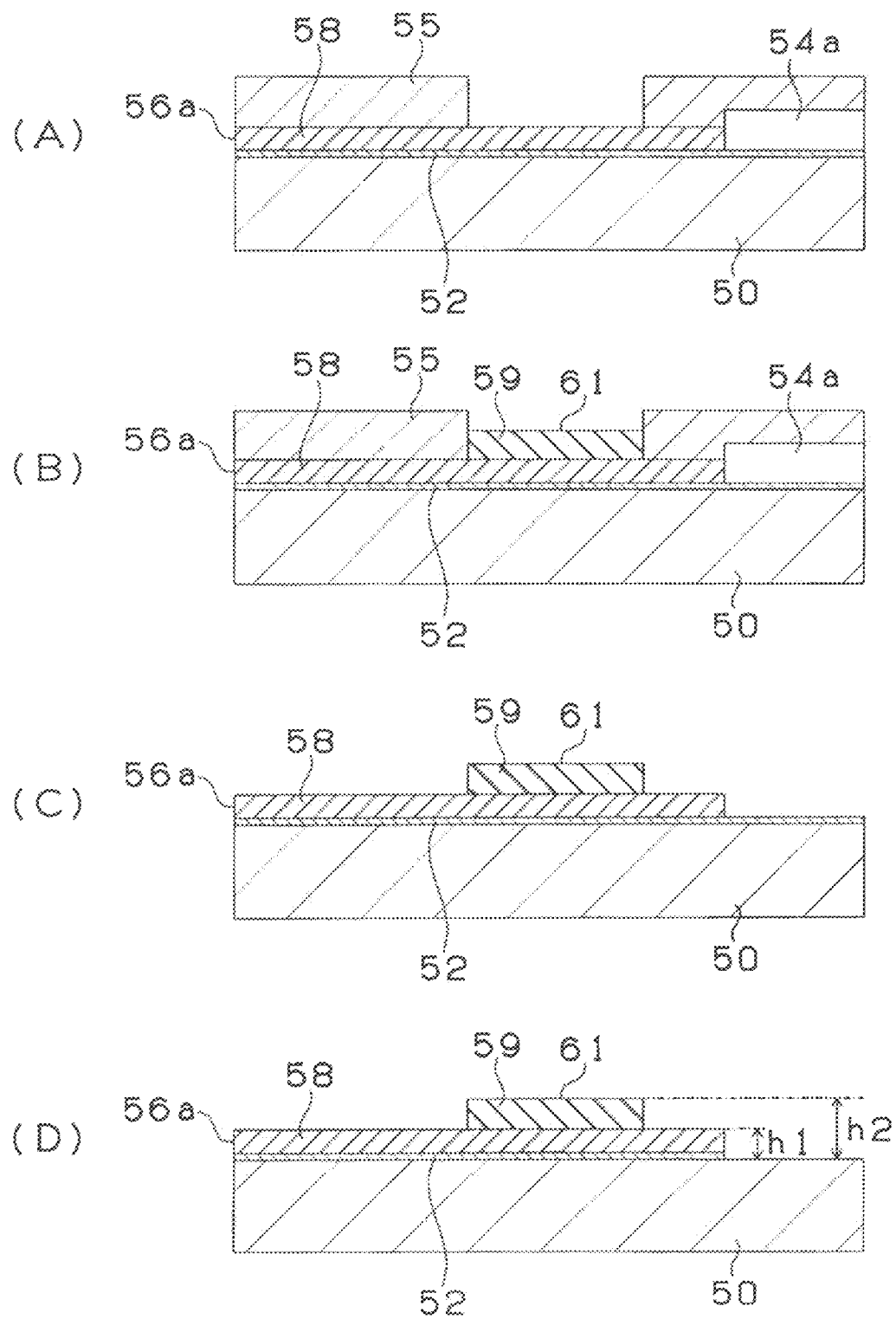
FIG. 3 are views showing the steps of a method for manufacturing a printed wiring board according to the first embodiment.
Figure 4:
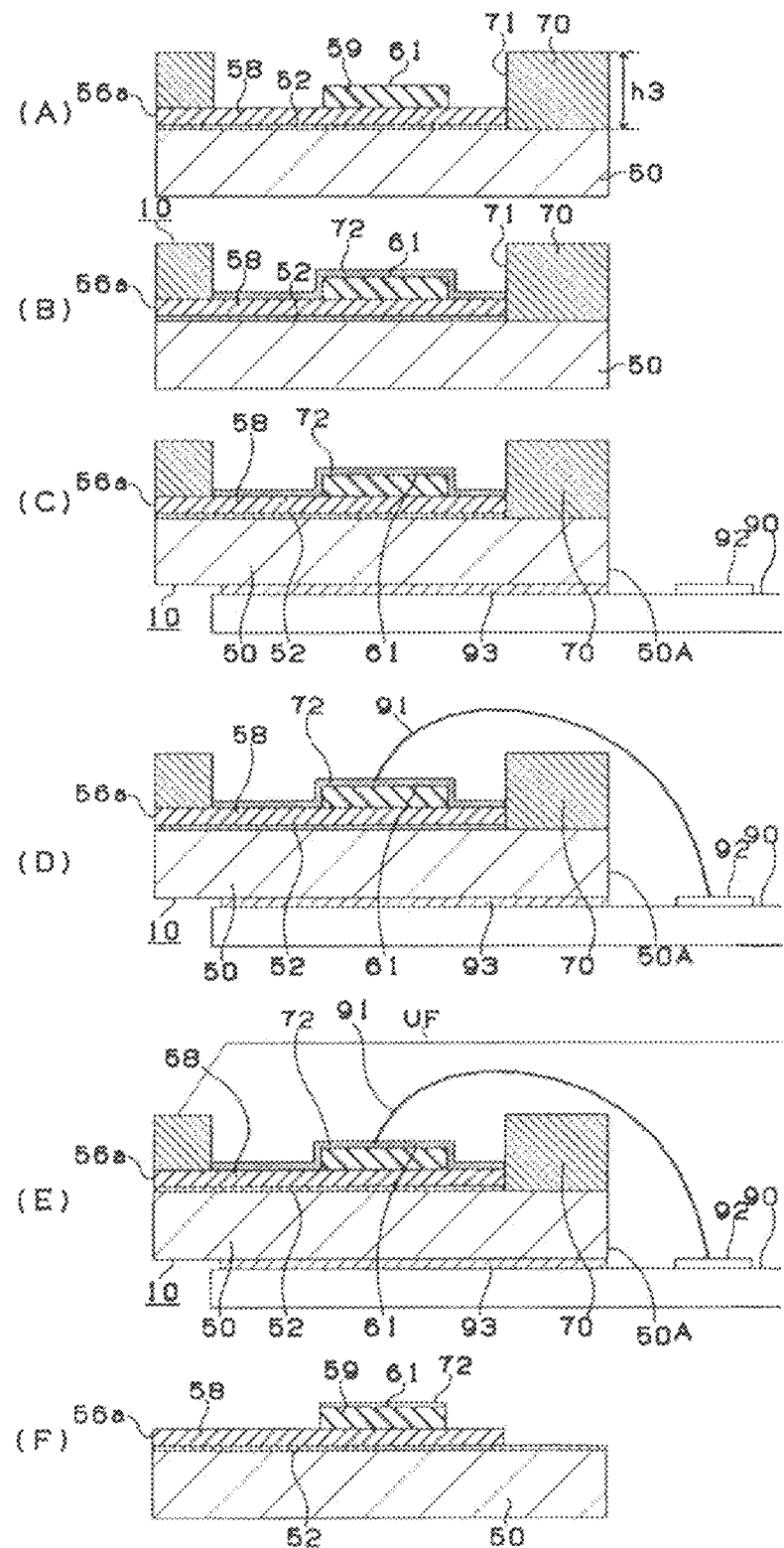
FIG. 4 are views showing the steps of a method for manufacturing a printed wiring board according to the first embodiment.

Next, a method for manufacturing printed wiring board 10 according to the first embodiment of the present invention is described with reference to FIGS. 2-4.

(1) In the center of insulation layer 50 made of resin, opening (50A) is formed (FIG. 2A). Here, only the left section of insulation layer 50 is shown in the drawings. Metal film 52 made of copper or the like is formed on insulation layer 50 (FIG. 2B). Such metal film may be formed by electroless copper plating. Here, instead of forming plated-metal film, metal foil may be laminated.

(2) First plating resist (54a) for forming a pad and conductive circuit is formed on metal film 52 (FIG. 2C). Then, the substrate is immersed in an electrolytic plating solution, and an electrical current is passed through metal film 52. Accordingly, first electrolytic copper-plated film (56a) is formed in the area where plating resist is not formed (FIG. 2D).

(3) Second plating resist 55 for forming a pad is formed on first electrolytic copper-plated film (56a), which will become conductive circuit (FIG. 3A). The substrate is immersed in an electrolytic plating solution, and second electrolytic copper-plated film 59 with a thickness of 2-10 µm is formed on the area of first electrolytic copper-plated film (56a) where second plating resist 55 is not formed (FIG. 3B).

(4) First plating resist (54a) and second plating resist 55 are removed and the following are formed: conductive circuit 58 made from first electrolytic copper-plated film (56a), and pad 61 made up of first electrolytic copper-plated film (56a) and second electrolytic copper-plated film 59 formed on first electrolytic copper-plated film (56a) (FIG. 3C). Then, metal film 52 under first plating resist (54a) is removed by etching (FIG. 3D). In doing so, conductive circuit 58 with thickness (h1) of 15 µm and pad 61 with thickness (h2) of 18-25 µm are formed.

(5) On insulation layer 50, opening portion 71 exposing pad 61 is arranged and solder resist layer 70 with thickness (h3) of 25-35 µm is formed (FIG. 4A). Here, opening portion 71 may expose the pad only, or may expose the surrounding portion of the pad as well.

(6) On pad 61 exposed through opening portion 71, metal coating 72 made of nickel-gold is formed (FIG. 4B). In doing so, printed wiring board 10 is completed. Metal coating 72 made of nickel-gold may be formed after electrolytic copper-plated film 59 shown in FIG. 3B is formed. In such a case, a metal coating is formed only on the top surface of the pad.

In the following, mounting an IC chip on printed wiring board 10 is described.

IC chip 90 is mounted under opening (50A) of printed wiring board 10 by means of adhesive 93 (FIG. 4C). Then, connection wire 91 is bonded between pad 92 of IC chip 90 and pad 61 of printed wiring board 10 to connect printed wiring board 10 and IC chip 90 (FIG. 4D). Underfill (UF) is filled to encapsulate IC chip 90 and connection wire 61 of printed wiring board 10 (FIG. 4D). In another example, metal coating 72 made of nickel-gold may be formed after electrolytic copper-plated film 59 shown in FIG. 3B is formed. In such a case, a metal coating is formed only on the top surface of the pad (FIG. 4F).

The thickness of pad 61 is preferred to be set lower than solder-resist layer 70. It is possible to form pad 61 to be thicker than solder-resist layer 70; however, since the mounting position of an electronic component will rise, the pad is preferred to be set lower than the solder-resist layer from the viewpoint of making a lightweight and thinner type. For metal coating 72, other than nickel and gold, a metal selected from among palladium, platinum, silver, lead, zinc and tin may be used.

In a printed wiring board according to the manufacturing method of the first embodiment, pad 61 is made up of first electrolytic copper-plated film (56a) and second electrolytic copper-plated film 59 with a thickness of 2-10 µm, and is 2-10 µm thicker than conductive circuit 58 made from first electrolytic copper-plated film (56a). Thus, when terminal 92 of IC chip 90 and pad 61 are wire-bonded, connection wire 91 seldom comes in contact with solder-resist layer 70. Accordingly, connection reliability may be enhanced between the electronic component and the pad. Also, since the thickness of solder-resist layer 70 is made uniform, the printed wiring board seldom warps. Furthermore, the percentage of metal in the pad portion increases by increasing the thickness of pad 61. Thus, thermal stress may be expected to be mitigated because of an increase in the percentage of rigid metal, and warping of the substrate may be suppressed. Thus, lowered connection reliability between the pad and the connection wire or faulty connections with the IC chip due to warping may seldom occur. Furthermore, since the thickness of the pad is large, the distance decreases from pad 61 to terminal 92 of IC chip 90, and the length of connection wire 61 becomes shorter, thus the electrical resistance of the connection wire itself may decrease.

Also, since the thickness is increased by forming the second plated-metal film on the first plated-metal film, compared with a manufacturing method in which the thickness is reduced through etching using an etching resist, side etching will not occur on the pad and conductive wiring. Thus, connection reliability will not decrease in the pad and conductive wiring.

Second Embodiment

Figure 5:
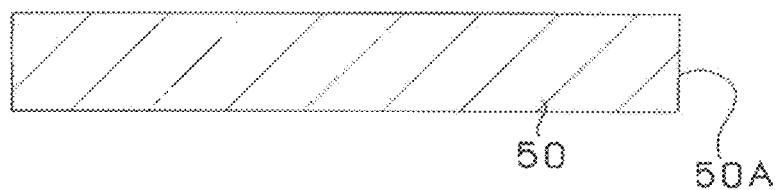
FIG. 5 are views showing the steps of a method for manufacturing a printed wiring board according to the second embodiment.
Figure 5:
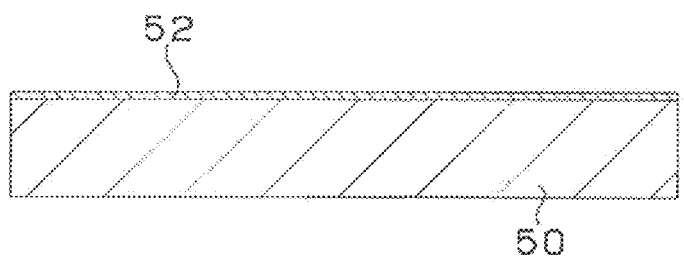
Figure 5:
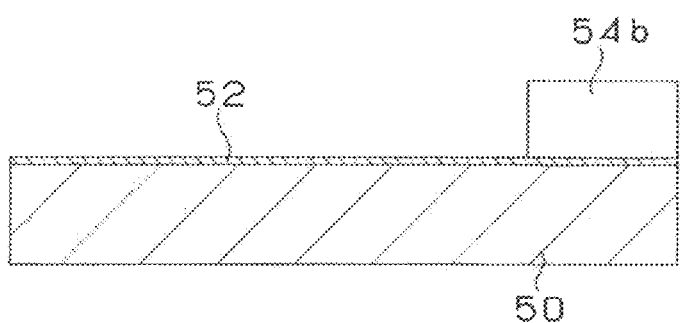
Figure 5:
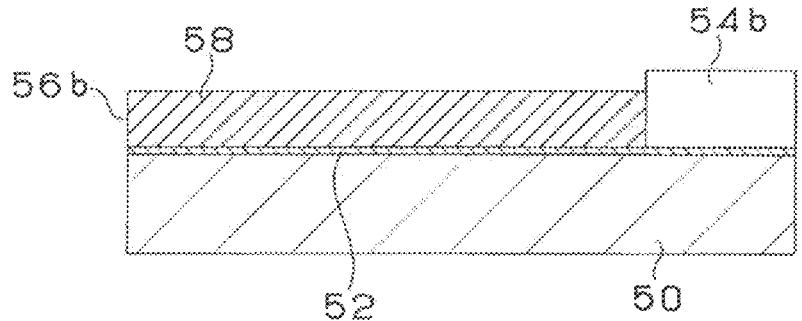
Figure 6:
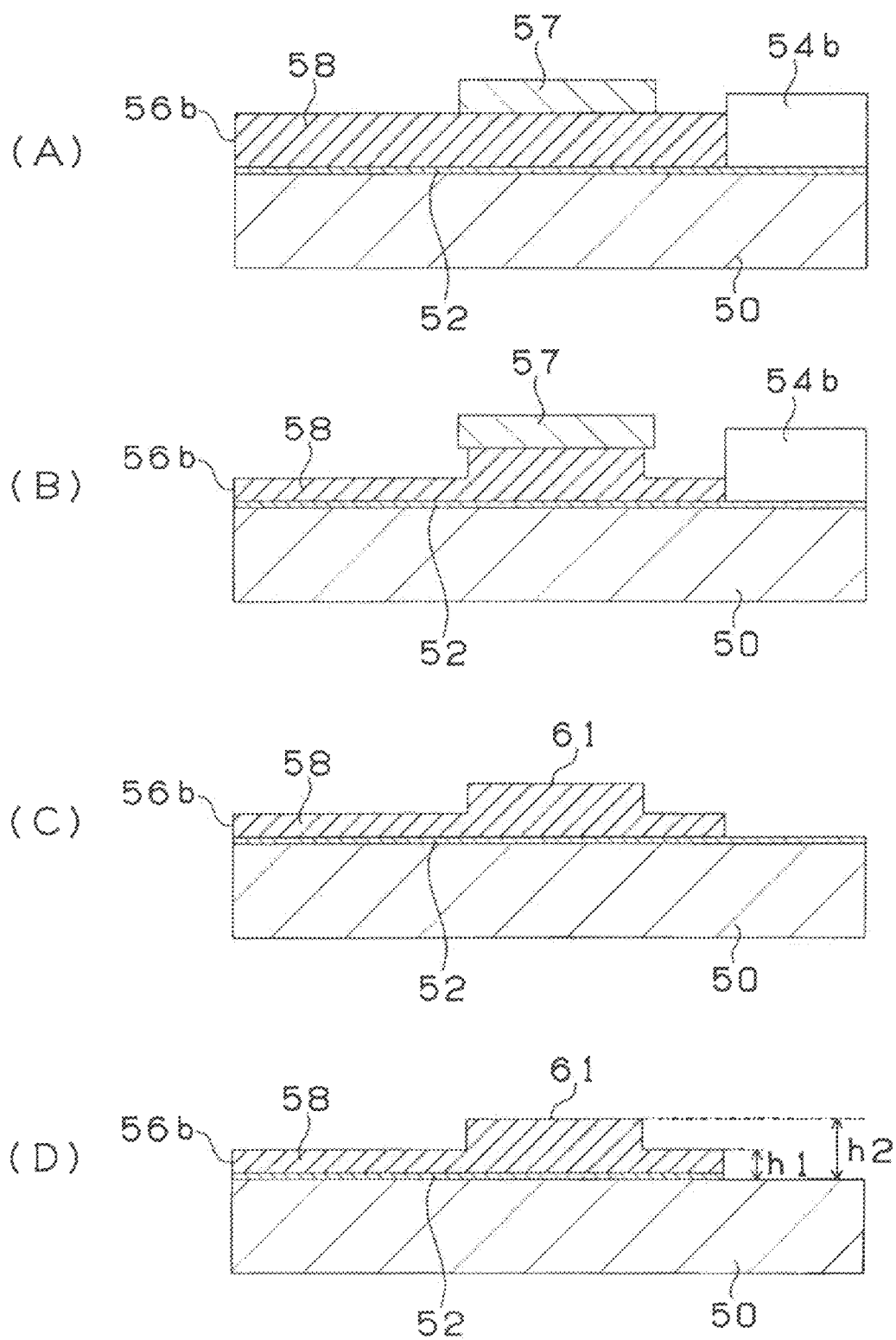
FIG. 6 are views showing the steps of a method for manufacturing a printed wiring board according to the second embodiment.
Figure 7:
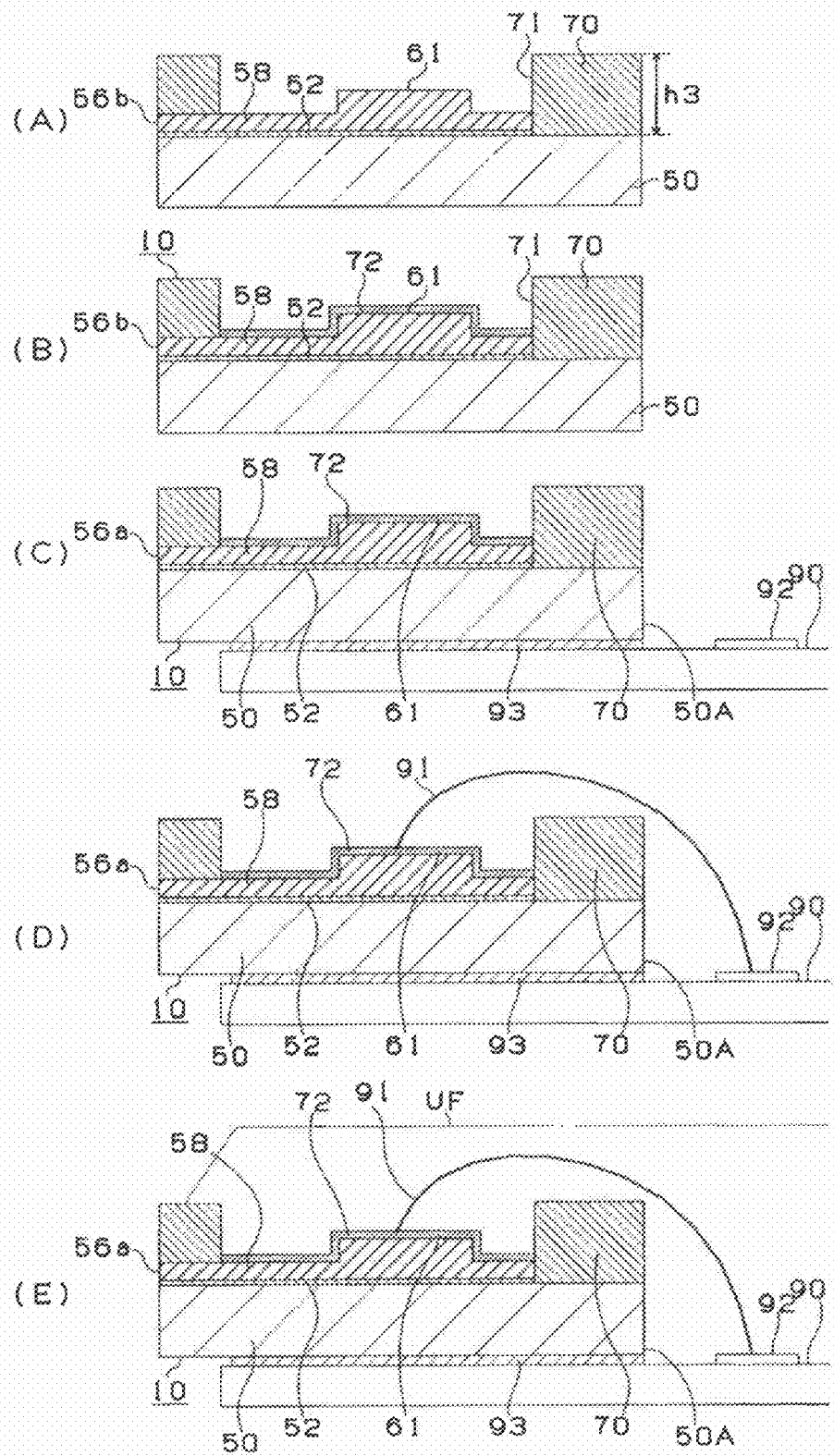
FIG. 7 are views showing the steps of a method for manufacturing a printed wiring board according to the second embodiment.

Printed wiring board 10 according to the second embodiment of the present invention is described with reference to FIGS. 5-7.

(1) Opening (50A) is formed in the center of insulation layer 50 made of resin (FIG. 5A). In the drawing, only the left section of insulation layer 50 is shown. On insulation layer 50 made of resin, metal film 52 made of copper or the like is formed (FIG. 5B). Such metal film may be formed by electroless copper plating. Here, instead of forming plated-metal film, metal foil may be laminated.

(2) Plating resist (54b) for forming a pad and conductive circuit is formed on metal film 52 (FIG. 5C). Then, the substrate is immersed in an electrolytic plating solution, and an electrical current is passed through metal film 52. Accordingly, electrolytic copper-plated film (56b) with a thickness of 18-25 μm is formed in the area where plating resist is not formed (FIG. 5D).

(3) Etching resist 57 is formed on the area of electrolytic copper-plated film (56b) that will become a pad (FIG. 6A). The substrate is immersed in an etchant, and portions of the surface of electrolytic copper-plated film 56 where etching resist 57 is not formed are etched away by a thickness of 2-10 μm (FIG. 6B). The resultant portions will become conductive circuit.

(4) Plating resist (54b) and etching resist 57 are removed and the following are formed: conductive circuit 58 made from the portions of electrolytic copper-plated film (56b) which were etched by a thickness of 2-10 μm, and pad 61 made from the portion of electrolytic copper-plated film (56b) which was not etched (FIG. 6C). Then, metal film 52 under plating resist (54b) is removed by etching (FIG. 6D). By doing so, conductive circuit 58 with thickness (h1) of 15 μm and pad 61 with thickness (h2) in the range of 18-25 μm are formed.

(5) Opening portion 71 exposing pad 61 is arranged on insulation layer 50, and solder resist layer 70 with thickness (h3) in the range of 25-35 μm is formed (FIG. 7A).

(6) On pad 61 exposed through opening portion 71, metal coating 72 made of nickel-gold is formed (FIG. 7B). Accordingly, printed wiring board 10 is completed.

Next, mounting an IC chip on printed wiring board 10 is described.

IC chip 90 is mounted under opening (50A) of printed wiring board 10 by means of adhesive 93 (FIG. 7C). Then, connection wire 91 is bonded between pad 92 of IC chip 90 and pad 61 of printed wiring board 10 to connect printed wiring board 10 and IC chip 90 (FIG. 7D). Underfill (UF) is filled to encapsulate IC chip 90 and connection wire 61 of printed wiring board 10 (FIG. 7D).

In printed wiring board 10 according to the manufacturing method of the second embodiment, pad 61 is thicker than conductive circuit 58, whose thickness is etched away by 2-10 μm. Thus, when terminal 92 of IC chip 90 and pad 61 are wire-bonded, connection wire 91 seldom comes in contact with solder-resist layer 70. Accordingly, connection reliability may be enhanced between the electronic component and the pad. Also, since the thickness of solder-resist layer 70 is made uniform, the printed wiring board seldom warps. Furthermore, the percentage of metal in the pad portion increases by increasing the thickness of pad 61. Thus, thermal stress may be expected to be mitigated because of an increase in the percentage of rigid metal, and warping of the substrate may be suppressed. Thus, lowered connection reliability between the pad and the connection wire or faulty connections with the IC chip due to warping may seldom occur. Furthermore, since the thickness of the pad is large, the distance decreases from pad 61 to terminal 92 of IC chip 90, and the length of connection wire 61 becomes shorter, thus the electrical resistance of the connection wire itself may decrease.

Also, during the etching, because plating resist (54a) remains on the side surface of pad 61 and the side surface of conductive circuit 58, side etching will not occur on pad 61 and conductive circuit 58. Thus, reliability will not decrease in the pad and circuit, compared with a manufacturing method in which side etching will occur during etching using an etching resist to reduce the thickness of the wiring.

Figure 10:
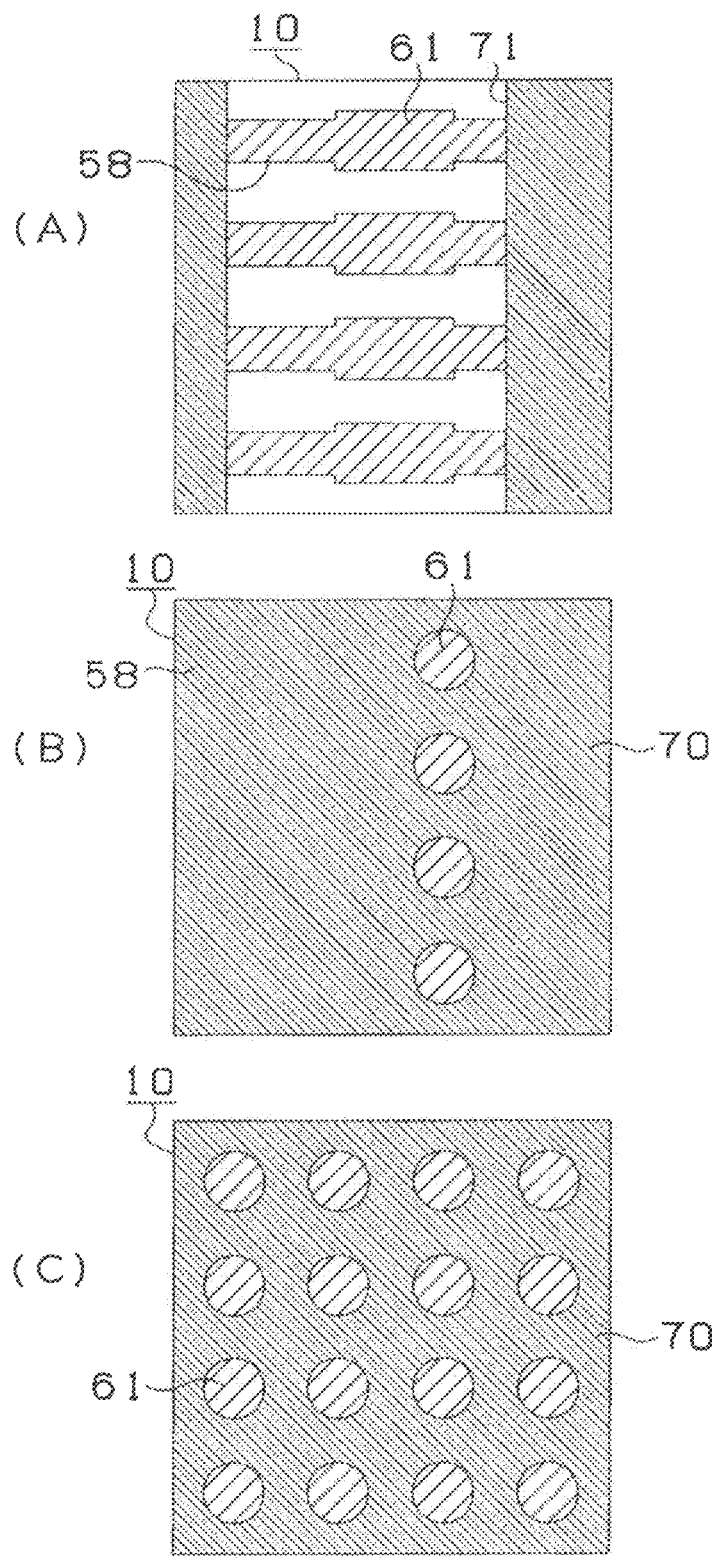
FIG. 10 are plan views showing modified examples of a printed wiring board according to the present invention.
Figure 11:
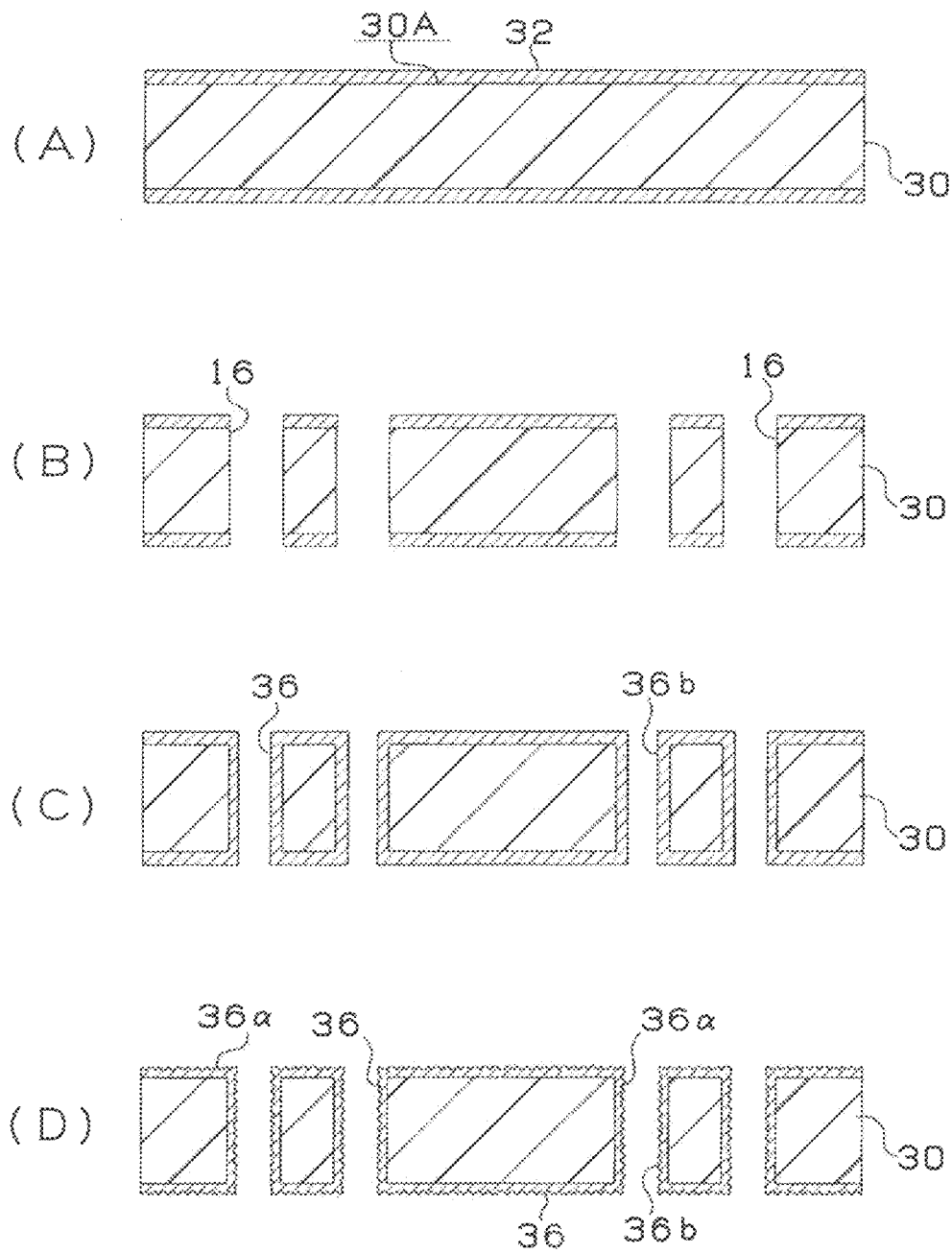
FIG. 11 are views showing the steps of a method for manufacturing a multilayer printed wiring board according to the first example of the present invention.
Figure 12:
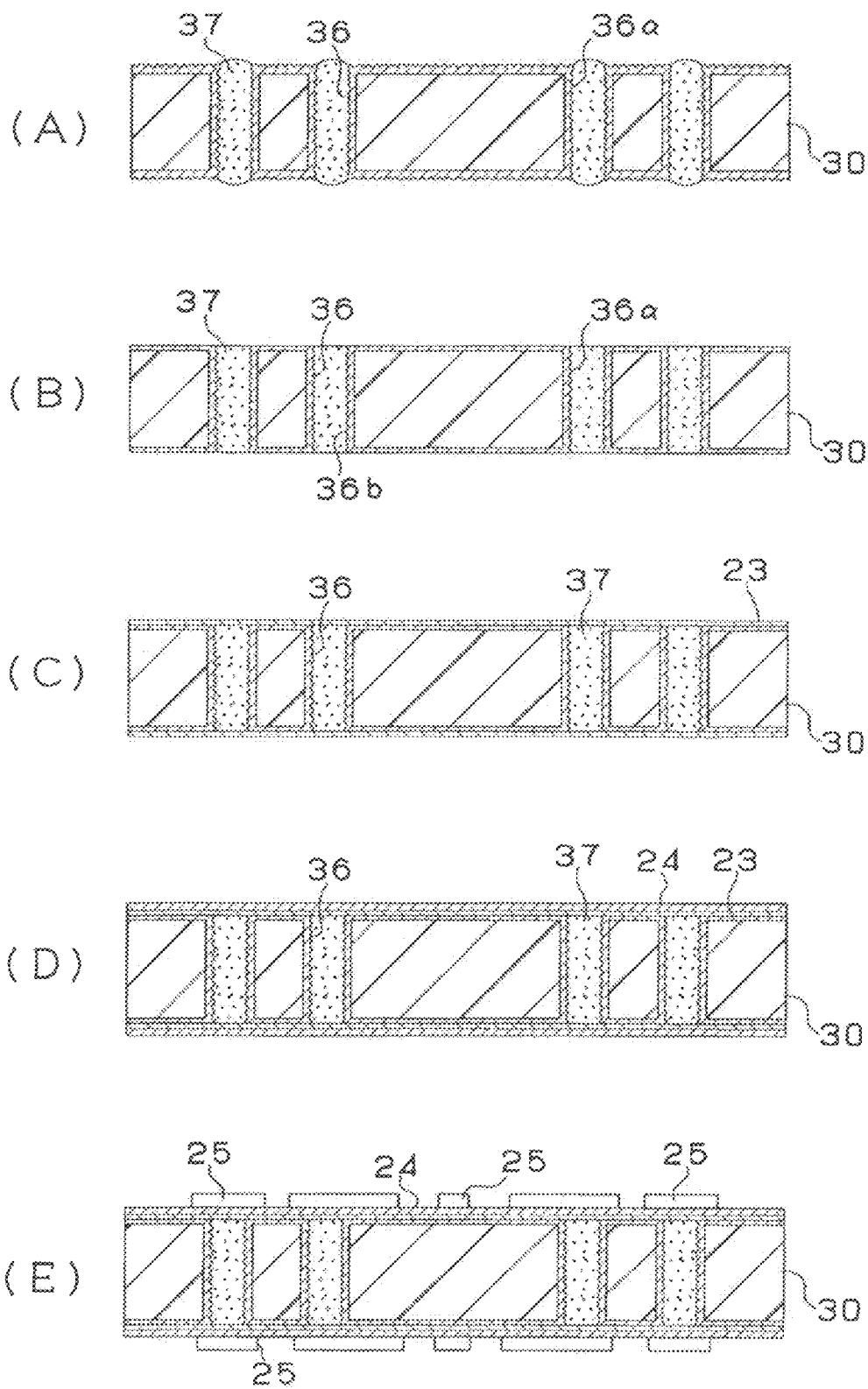
FIG. 12 are views showing the steps of a method for manufacturing a multilayer printed wiring board according to the first example of the present invention.
Figure 13:
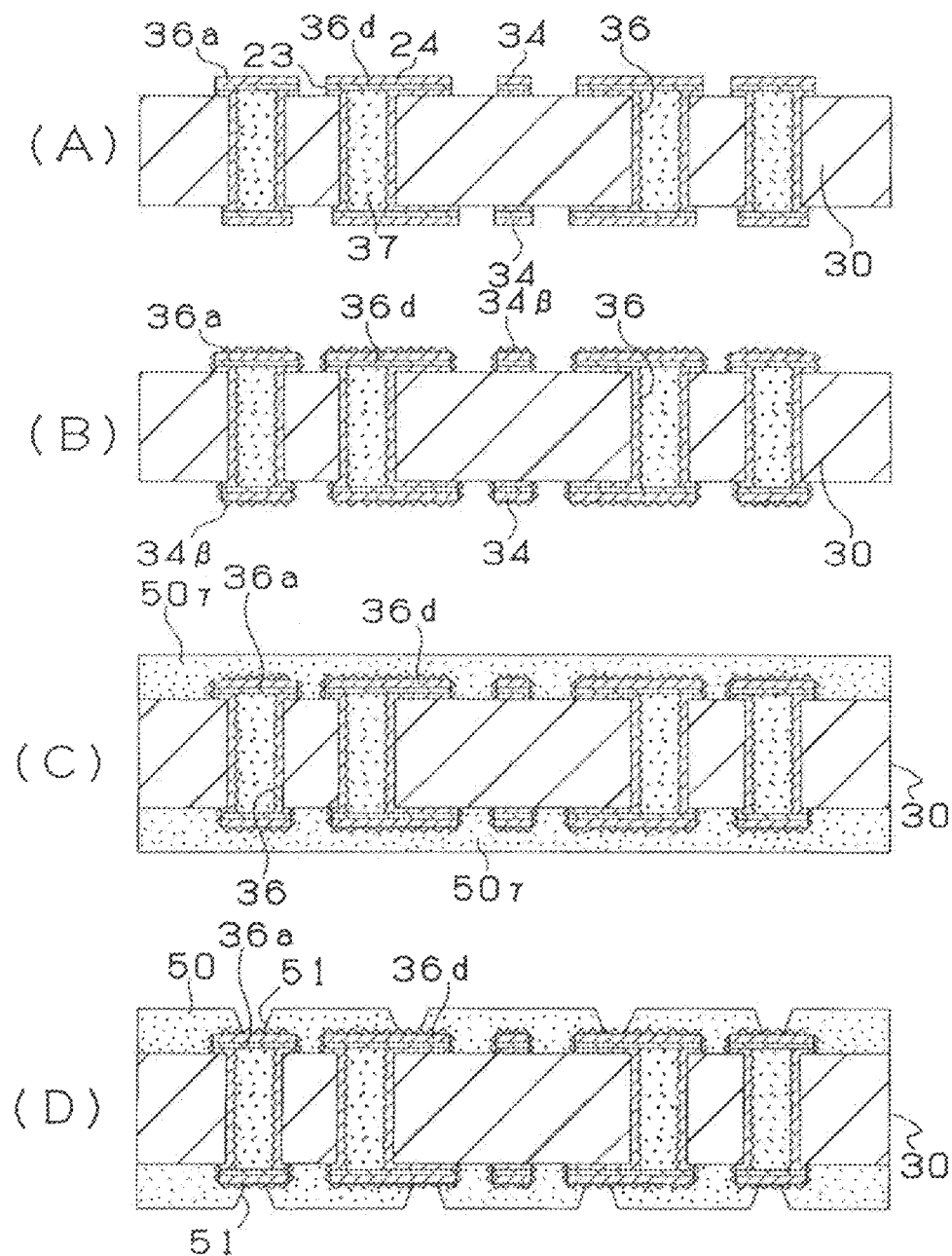
FIG. 13 are views showing the steps of a method for manufacturing a multilayer printed wiring board according to the first example of the present invention.
Figure 14:
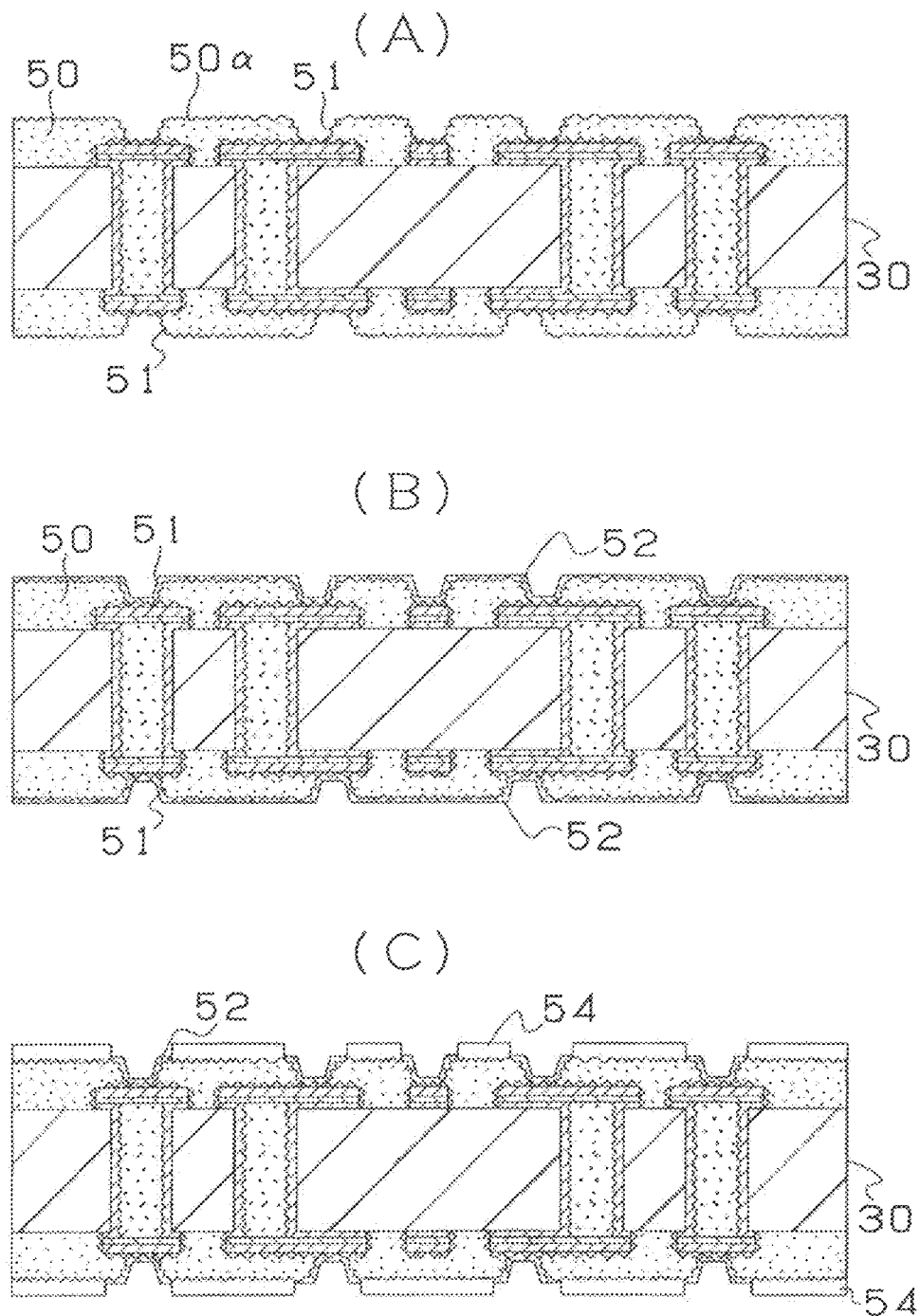
FIG. 14 are views showing the steps of a method for manufacturing a multilayer printed wiring board according to the first example of the present invention.
Figure 15:
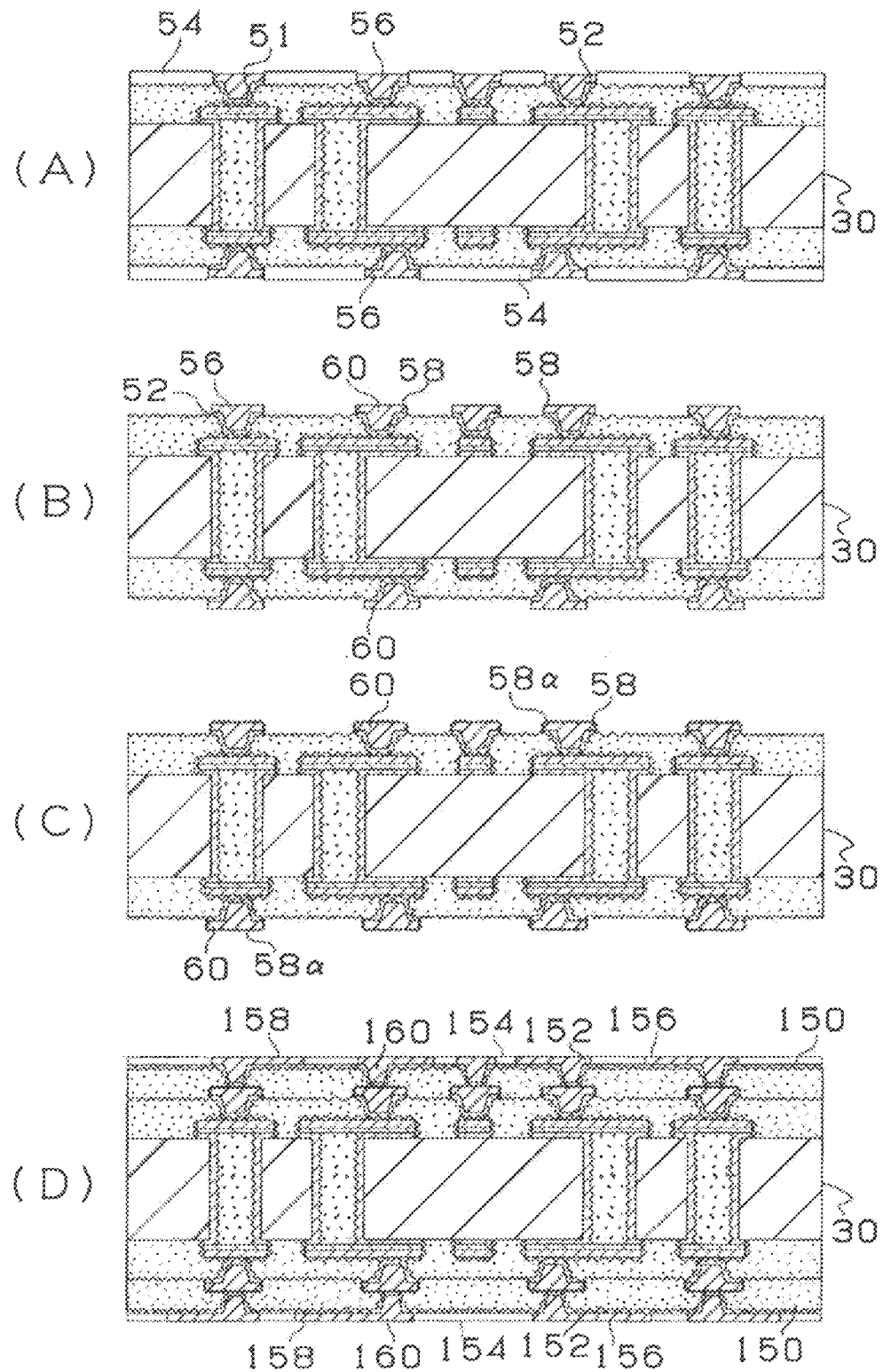
FIG. 15 are views showing the steps of a method for manufacturing a multilayer printed wiring board according to the first example of the present invention.
Figure 16:
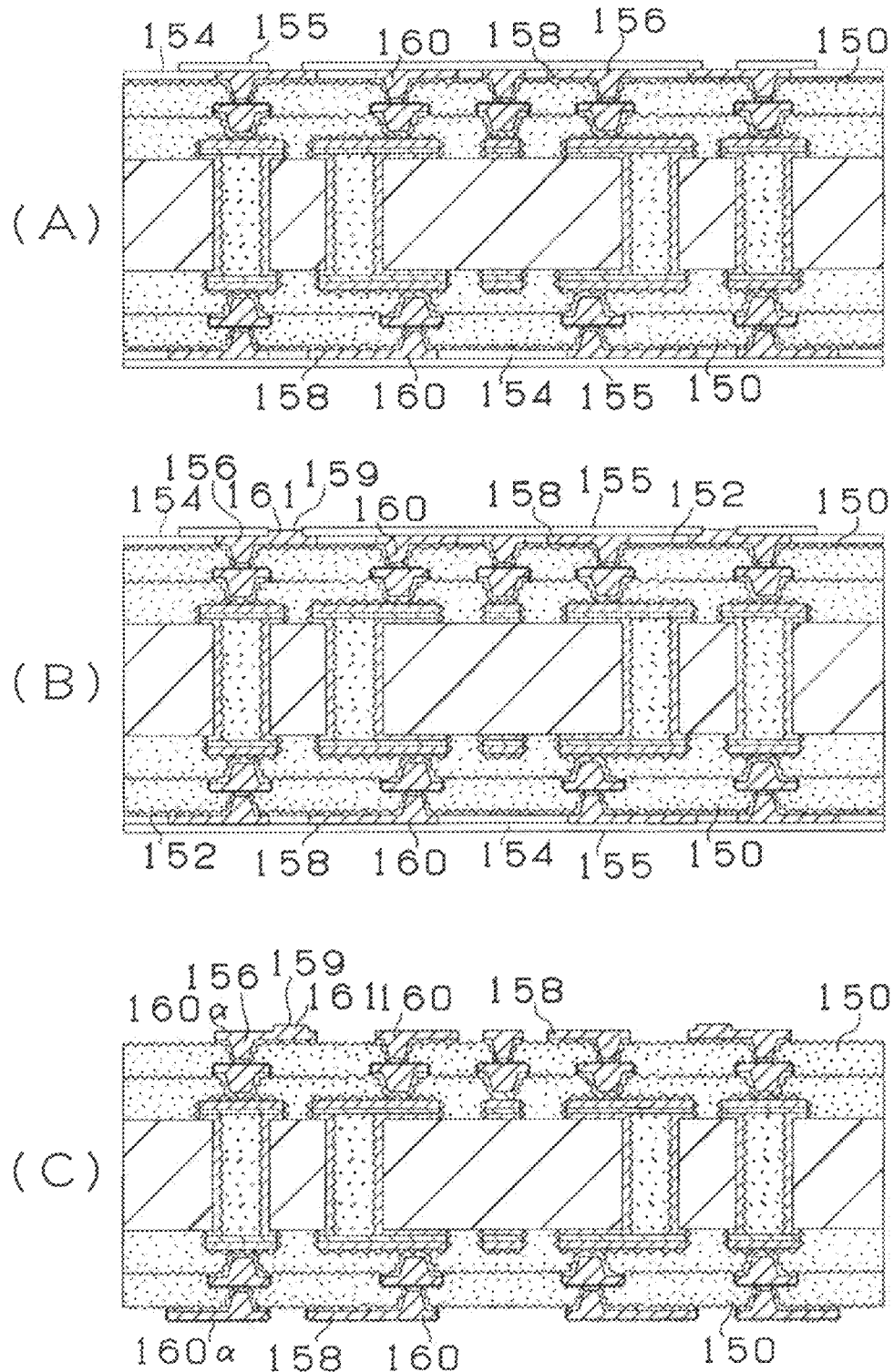
FIG. 16 are views showing the steps of a method for manufacturing a multilayer printed wiring board according to the first example of the present invention.
Figure 17:
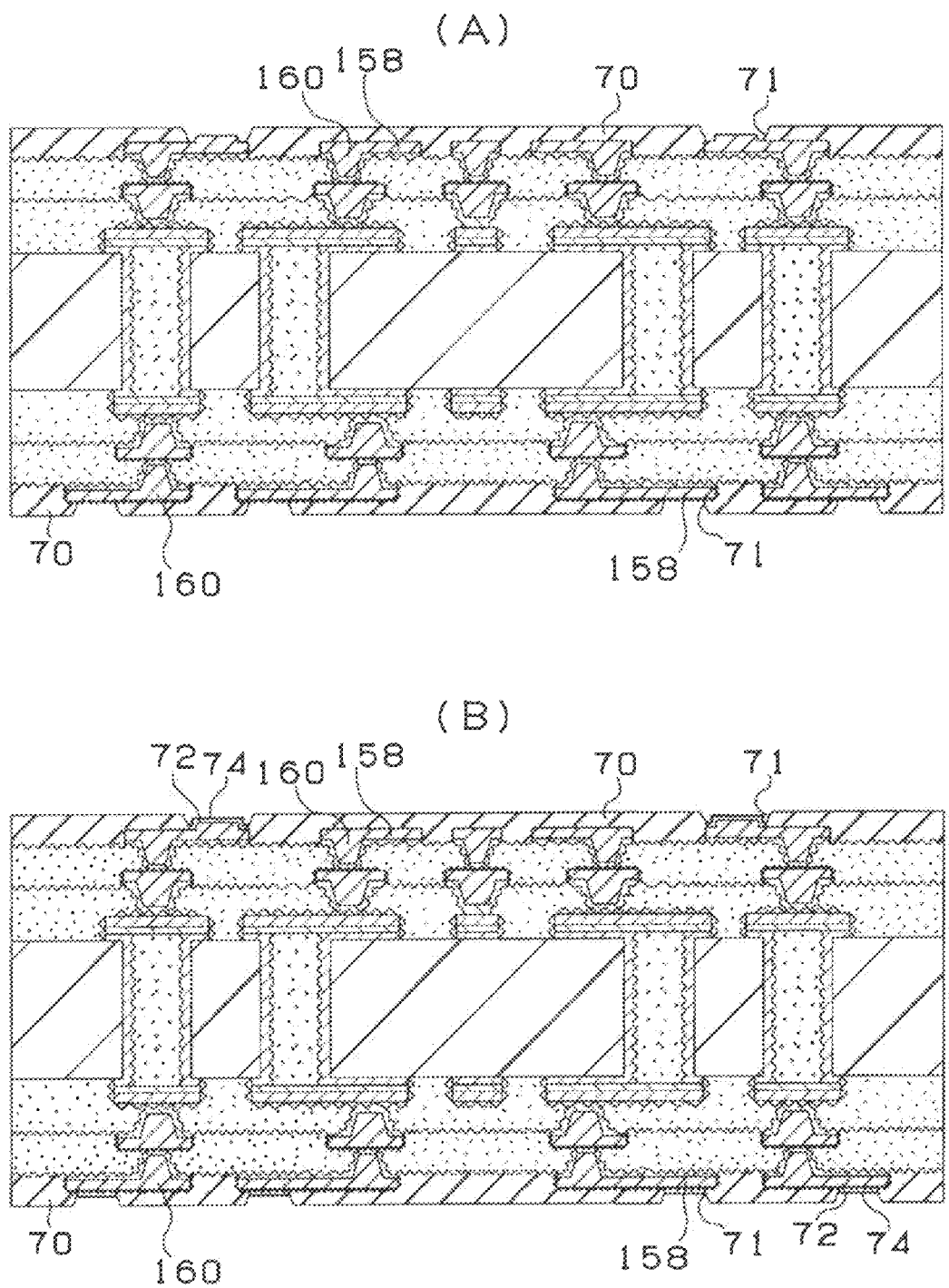
FIG. 17 are views showing the steps of a method for manufacturing a multilayer printed wiring board according to the first example of the present invention.

In printed wiring boards described in the first and second embodiments, the width of pads is not limited to those having the same width as the wiring. As shown in FIG. 10A, multiple rectangular pads 61 may be exposed through opening 71 arranged in solder-resist layer 70. Alternatively, as shown in FIG. 10B, pads 61 with a substantially circular shape may be formed. Also, as shown in FIG. 10C, only pads may be formed in a grid configuration and exposed through the solder resist, which is higher than such pads.

Figure 8:
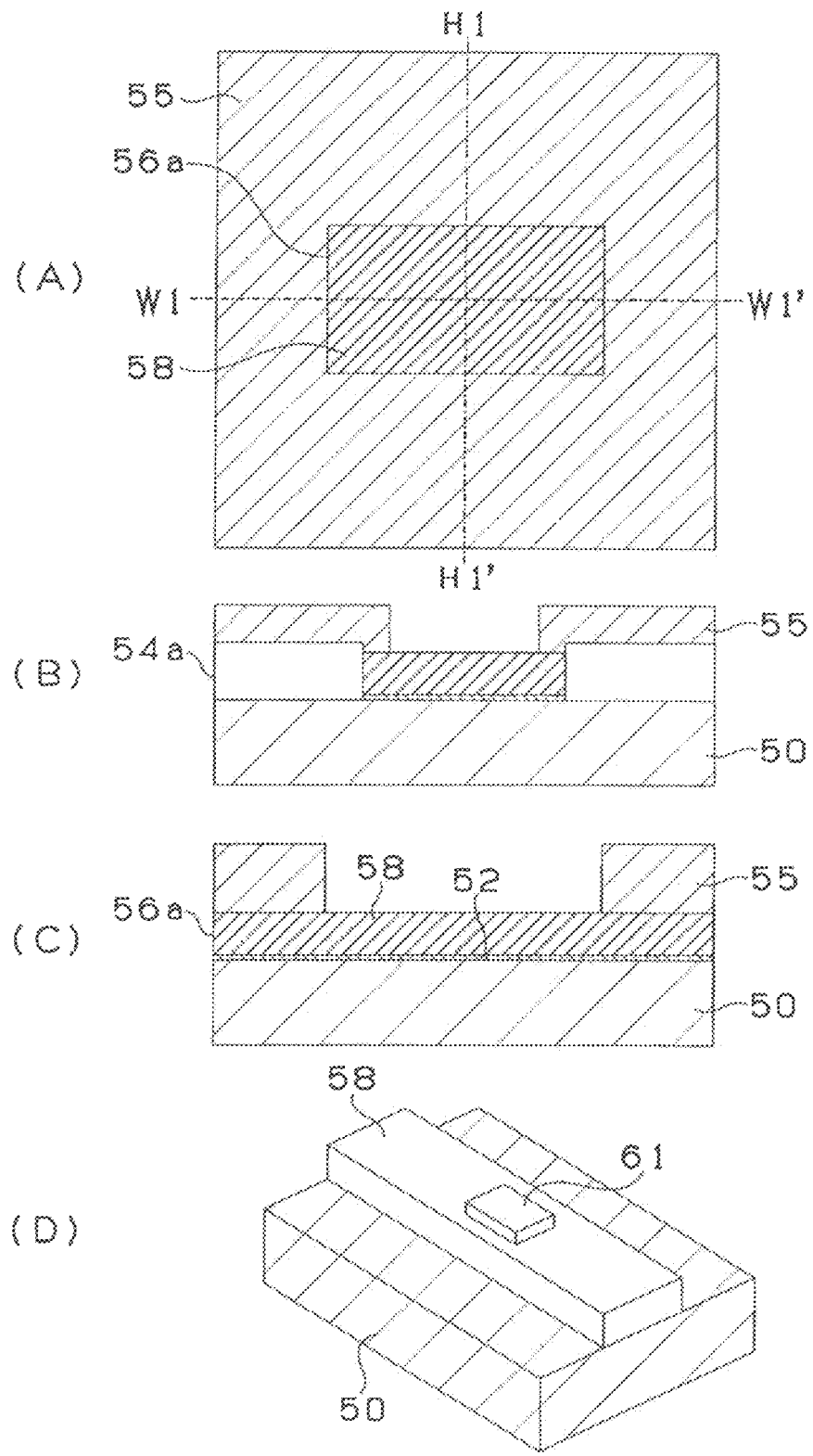
FIG. 8 is a top view and cross-sectional views showing a modified example of the multilayer printed wiring board according to the first embodiment.

Furthermore, as a modified example of the first embodiment, the following method may also be employed. FIG. 8A is a top view showing second plating resist 55 formed on printed wiring board 10. FIGS. 8B and 8C are cross-sectional views taken respectively from the (H1-H1') line and (W1-W1') line in FIG. 8A. Second plating resist 55 is formed to be narrower than the width of the first electrolytic copper-plated film. In such a case, pad 61 formed later will be set to be narrower than conductive circuit 58 both lengthwise and crosswise as shown in FIG. 8D.

Also, the following may be employed as a modified example of the second embodiment.

Figure 9:
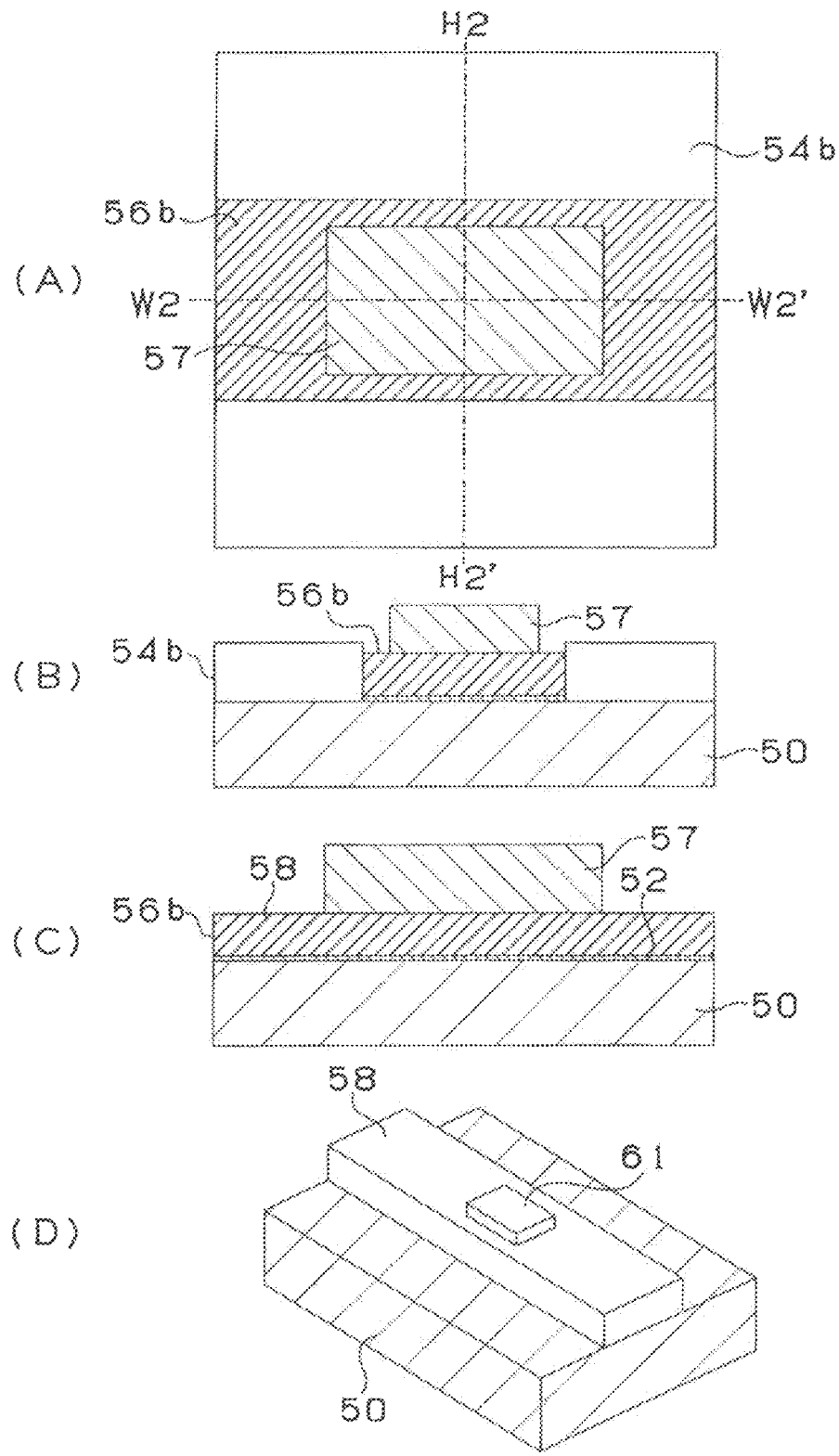
FIG. 9 is a top view and cross-sectional views showing a modified example of the multilayer printed wiring board according to the second embodiment.

FIG. 9A is a top view showing etching resist 57 formed on the first electrolytic copper-plated film. FIGS. 9B and 9C are cross-sectional views taken respectively from the (H2-H2') line and (W2-W2') line in FIG. 9A. Etching resist 57 is formed to be narrower than the width of the first electrolytic copper-plated film. In such a case, pad 61 formed later will be set to be narrower than conductive circuit 58 both lengthwise and crosswise as shown in FIG. 9D.

EXAMPLES

First Example

Figure 18:
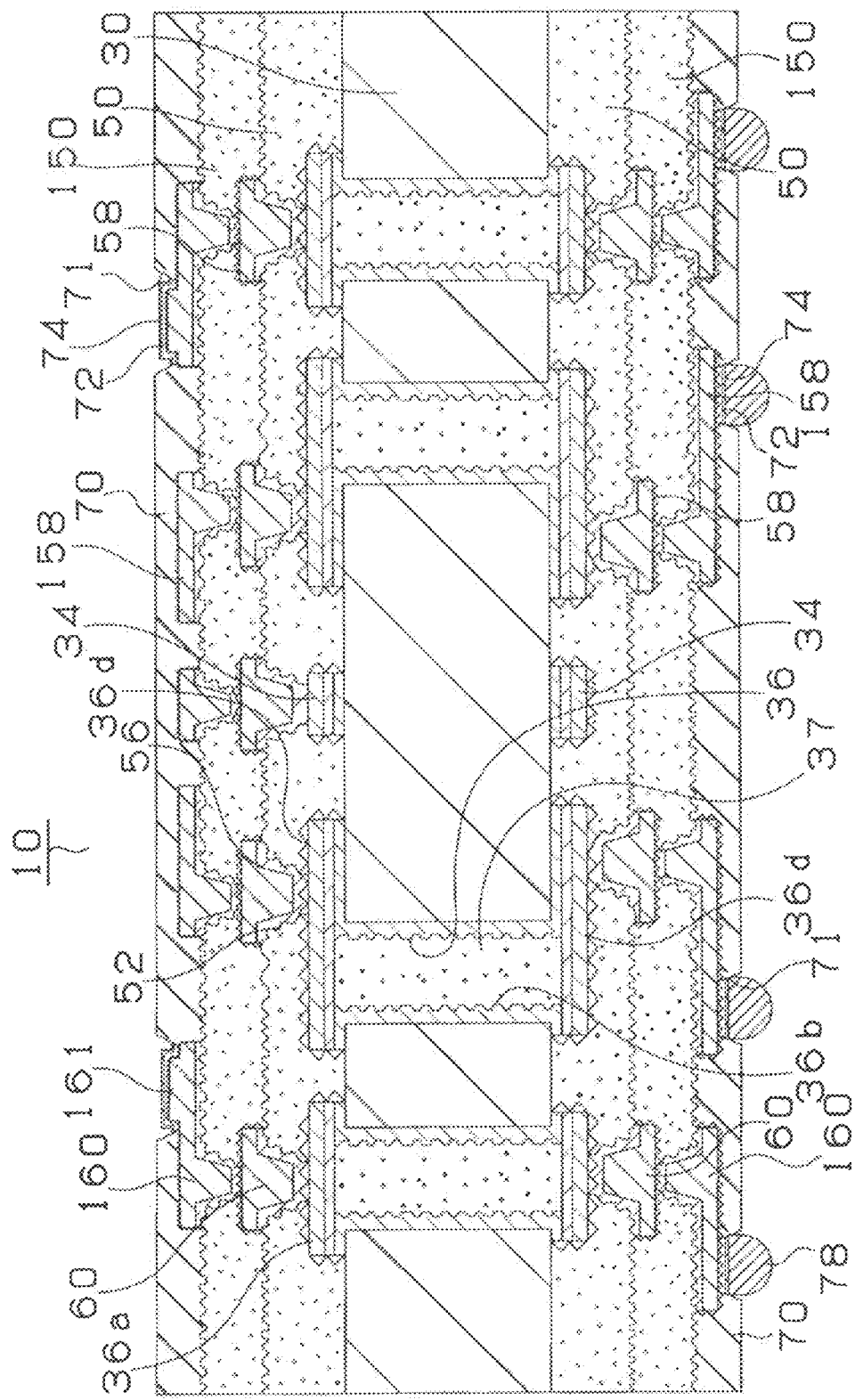
FIG. 18 is a cross-sectional view of a multilayer printed wiring board according to the first example.

The structure of built-up multilayer printed wiring board 10 according to the first example of the present invention is described with reference to FIGS. 11-19. FIG. 18 is a cross-sectional view showing multilayer printed wiring board 10, and FIG. 19 is a view showing a state in which IC chip 90 is mounted on multilayer printed wiring board 10 shown in FIG. 18, which is further mounted on daughterboard 94. As shown in FIG. 18, in multilayer printed wiring board 10, conductive circuits 34 are formed on the surfaces of core substrate 30.

The front and back surfaces of core substrate 30 are connected by means of through-holes 36. Through-holes 36 are made up of plated cover layers (36a, 36d) which form through-hole lands and of side-wall conductive layers (36b). Resin filler 37 is filled in the interiors surrounded by side-wall conductive layers (36b). Resin insulation layers 50 having filled vias 60 and conductive circuits 58 and resin insulation layers 150 having filled vias 160 and conductive circuits 158 are formed on plated cover layers (through-hole lands) (36a, 36d). Pads 161 are formed at predetermined spots of upper-side conductive circuit 158. Solder resist layers 70 are formed on resin insulation layers 150. Pads 161 are exposed through opening portions 71 of upper-side solder resist layer 70; and bumps 78 are formed in lower-side opening portions 71.

As shown in FIG. 19, pads 161 on the upper-side of multilayer printed wiring board 10 are connected to bumps 92 of IC chip 90 by means of connection wires 91. Meanwhile, under-side solder bumps 78 are connected to lands 96 of daughterboard 94. Underfill (UF) is filled around IC chip 90 to encapsulate it with resin.

Next, a method for manufacturing multilayer printed wiring board 10 described with reference to FIG. 19 is described by referring to FIGS. 11-18.

(1) Copper-clad laminate (30A) was prepared as a starting material. The copper clad-laminate was made by laminating copper foil 32 with a thickness of 5-250 μm on both surfaces of insulative substrate 30 made of glass-epoxy resin or bis-maleimide triazine (BT) resin with a thickness of 0.2-0.8 mm (FIG. 11A). First, by drilling the copper-clad laminate, penetrating holes 16 were formed (FIG. 11B). Then, side-wall conductive layers (36b) of through-holes 36 were formed by performing electroless plating and electrolytic plating (see later-described plating solution and conditions (steps (13) and (15)) (FIG. 11C). The opening diameter of penetrating holes 16 was set at Φ0.1-0.25 mm by drill selection, and the pitch was set at 0.15-0.575 mm.

(2) Substrate 30 with through holes 36 was washed with water and dried, a black-oxide treatment was conducted using a solution containing NaOH (10 g/l), NaClO$_2$ (40 g/l) and Na$_3$PO$_4$ (6 g/l) as a black-oxide bath (oxidation bath), followed by a reduction treatment using a solution containing NaOH (10 g/l) and NaBH$_4$ (6 g/l) as a reduction bath. Accordingly, roughened surfaces (36α) were formed on side-wall conductive layers (36b) of through-holes 36 and on the surfaces of the substrate (FIG. 11D).

(3) Next, filler 37 (non-conductive copper paste padding, brand name: DD paste, made by Tatsuta Electric Wire & Cable, Co., Ltd.) containing copper particles with an average particle diameter of 10 μm was filled in through-holes 36 by screen printing, dried and cured (FIG. 12A). A mask with openings corresponding to through-hole portions was placed on the substrate, and the paste was applied by printing to fill the through-holes. After that, the paste was dried and cured.

In the following, filler 37 bulging from through-holes 36 was removed by belt-sander polishing using #600 belt sanding paper (made by Sankyo-Rikagaku Co., Ltd.). Then, buff polishing to remove scratches from such belt sanding was conducted to level the surfaces of substrate 30 (see FIG. 12B). In doing so, substrate 30 was obtained where side-wall conductive layers (36b) of through-holes 36 and resin filler 37 were firmly adhered by means of roughened layer (36α).

(4) On the surfaces of substrate 30 leveled in step (3), palladium catalyst (made by Atotech) was applied and electroless copper plating was performed. Accordingly, electroless copper-plated films 23 with a thickness of 0.6 μm were formed (see FIG. 12C).

(5) Next, electrolytic copper plating was performed under the following conditions to form electrolytic copper-plated films 24 with a thickness of 15 μm. The portions that will become conductive circuits 34 were thickened, and the portions that will become plated cover layers (through-hole lands) to cover filler 37 filled in through-holes 36 were formed (FIG. 12D).

[Electrolytic Plating Solution]

| | |
|---|---|
| sulfuric acid | 180 g/l |
| copper sulfate | 80 g/l |
| additive (brand name: Cupracid GL, made by Atotech Japan) | 1 ml/l |

[Electrolytic Plating Conditions]

| | |
|---|---|
| current density | 1 A/dm$^2$ |
| time | 30 minutes |
| temperature | room temperature |

(6) On both surfaces of substrate 30 where portions that will become conductive circuits and plated-cover layers were formed, commercially available photosensitive dry film was laminated, and a patterned mask was placed on the film, which was then exposed to light at 100 mJ/cm$^2$ and developed with a 0.8% sodium carbonate solution. Accordingly, etching resists 25 with a thickness of 15 μm were formed (see FIG. 12E).

(7) Next, portions of plated-metal films (23, 24) and copper foil 32 where etching resist 25 was not formed were dissolved and removed by an etchant mainly containing copper (II) chloride. Then, etching resists 25 were removed by a 5% KOH solution. Accordingly, independent circuits 34 and plated-cover layers (36a, 36d) covering filler 37 were formed (see FIG. 13A). This process is a so-called tenting method.

(8) Next, roughened layers (34β) were formed on the surfaces of conductive circuit 34 and plated-cover layers (36a, 36d) covering filler 37, using a micro etchant (CZ series) made by Mec Co., Ltd. (FIG. 13B).

(9) On both surfaces of the substrate, resin film (50γ) for interlayer resin insulation layer (brand name ABF-45SH, made by Ajinomoto Fine-Techno Co., Inc.) with a slightly larger size than the substrate was placed and preliminarily pressed under the conditions of pressure 0.45 MPa, temperature 80° C. and pressing time 10 seconds, and cut to size. Then, by laminating the film using vacuum laminator equipment under the following conditions, resin insulation layers 50 were formed (FIG. 13C). Namely, the resin film for interlayer resin insulation layer on the substrate was given a final pressing under the conditions of vacuum degree 67 Pa, pressure 0.47 MPa, temperature 85° C. and pressing time 60 seconds, and then thermoset at 170° C. for 40 minutes.

(10) Next, using a CO2 gas laser with a wave length of 10.4 μm, via hole openings 51 were formed in resin insulation layers 50 under the conditions of beam diameter 4.0 mm, top-hat mode, pulse width 3-30 μsec., mask through-hole diameter 1.0-5.0 mm and number of shots 1-3 (FIG. 13D). The above laser conditions were adjusted so that the bottom diameter of via holes in resin insulation layers 50 would become Φ60 μm. As a result, the bottom diameter of the via holes formed on plated-cover layers (36a, 36d) was made Φ60 μm.

(11) The substrate with filled-via openings 51 was immersed for 10 minutes in an 80° C. solution containing permanganic acid 60 g/l, and epoxy-resin particles residing on the surfaces of resin insulation layers 50 were dissolved and removed. Accordingly, roughened surfaces (50α) were formed on the surfaces of resin insulation layers 50 including the inner walls of filled-via openings 51 (FIG. 14A).

(12) Next, after the above treatments, the substrate was immersed in a neutralizer (made by Shipley Company, LLC) and was washed with water. Furthermore, by applying palladium catalyst on the roughened surfaces (roughened depth 3 μm) of the substrate, catalyst nuclei were adhered to the surfaces of the resin insulation layers and the inner-wall surfaces of the filled-via openings. Namely, the substrate was immersed in a catalytic solution containing palladium chloride ($PbC_{l2}$) and stannous chloride ($SnC_{l2}$), and the catalyst was adhered to the surfaces through deposition of palladium metal.

(13) Next, the substrate with applied catalyst was immersed in an electroless copper plating solution (Thru-Cup PEA) made by C. Uyemura & Co., Ltd. to form electroless copper-plated film with a thickness of 0.3-3.0 μm on the entire roughened surfaces. Accordingly, the substrate was obtained where electroless copper-plated film 52 was formed on the surfaces of resin insulation layers 50 including the inner walls of via-hole opening 51 (FIG. 14B).

[Electroless Plating Conditions]
solution temperature at 34° C. for 45 minutes

(14) On the substrate having electroless copper-plated film 52, commercially available photosensitive dry film was laminated, and a mask was placed on the film, which was then exposed to light at 110 mJ/cm² and developed with a 0.8% sodium carbonate solution. Accordingly, plating resists 54 with a thickness of 25 μm were formed (FIG. 14C).

(15) Then, after substrate 30 was cleansed with 50° C. water to degrease it and washed with 25° C. water, the substrate was further cleansed with sulfuric acid. Then, electrolytic plating was performed under the following conditions to form electrolytic plated-metal film 56 (FIG. 15A).

[Electrolytic Plating Solution]

| | |
|---|---|
| sulfuric acid | 2.24 mol/l |
| copper sulfate | 0.26 mol/l |
| additive | 19.5 ml/l |
| leveling agent | 50 mg/l |
| polishing agent | 50 mg/l |

[Electrolytic Plating Conditions]

| | |
|---|---|
| current density | 1 A/dm² |
| time | 70 minutes |
| temperature | 22 ± 2° C. |

(16) Furthermore, after plating resists 54 were removed using a 5% KOH solution, electroless plated-metal film under the plating resists was removed by etching using a mixed solution of sulfuric acid and hydrogen peroxide. Accordingly, independent conductive circuits 58 and filled vias 60 were formed (FIG. 15B).

(17) Next, by conducting the same treatment as in above step (4), roughened surfaces (58α) were formed on the surfaces of conductive circuits 58 and filled vias 60. The thickness of upper-layer conductive circuits 58 was 15 μm (FIG. 15C). However, the thickness of upper-layer conductive circuits may be set anywhere between 5 and 25 μm.

(18) By repeating steps (9)-(15), conductive circuits 158 and filled vias 160 made of electroless plated-metal film 152 and electrolytic plated-metal film 156 were formed in areas of upper-layer resin insulation layers 150 where plating resist 154 was not formed (FIG. 15D).

(19) Second plating resist 155 for forming pads was formed on electrolytic plated-metal film 156 which will later become wiring patterns (FIG. 16A).

(20) The substrate was immersed in an electrolytic plating solution to form electrolytic copper-plated film 159 with a thickness of 2-10 μm on electrolytic plated-metal film 156 in areas where second plating resist 55 was not formed (FIG. 16B).

(21) Plating resists 154 and second plating resists 155 were removed, and pads 161 made from copper-plated film 159 were formed on circuit 158, which was made from electrolytic plated-metal film 156. Then, electroless plated-metal film 152 under plating resists 154 was etched away and roughened layers (160α) were formed (FIG. 16C).

(22) Next, on both surfaces of a multilayer wiring substrate, commercially available solder-resist composition (70) was applied to be 25-35 μm thick, which was then dried at 70° C. for 20 minutes and at 70° C. for 30 minutes. Then, a 5-mm thick photomask with a pattern of solder-resist openings was adhered to solder resist layers 70, which were then exposed to ultraviolet rays at 1000 mJ/cm² and developed using a DMTG solution. Accordingly, openings 71 were formed with a diameter of 200 μm (FIG. 17A). In addition, heat treatments were conducted at 80° C. for an hour, 100° C. for an hour, 120° C. for an hour and 150° C. for three hours to cure the insulation layers. Accordingly, resist pattern layers having openings are formed with a thickness of 20-30 μm.

(23) Next, the substrate with solder-resist layers 70 was immersed for 20 minutes in an electroless nickel plating solution of pH=4.5 containing nickel chloride ($2.3 \times 10^{-1}$ mol/l), sodium hypophosphite ($2.8 \times 10^{-1}$ mol/l) and sodium citrate ($1.6 \times 10^{-1}$ mol/l); and a 0.5 μm-thick nickel-plated layer 72 was formed in opening portions 71. Furthermore, the substrate was immersed for 7.5 minutes at 80° C. in an electroless gold plating solution containing gold potassium cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l). Accordingly, a 0.03 μm-thick gold-plated layer 74 was formed on nickel-plated layer 72 (FIG. 17B). Other than a nickel-gold layer, a single layer of tin or a noble metal layer (gold, silver, palladium, platinum or the like) may be formed.

(24) After that, tin-antimony solder paste was printed in the openings of the lower-side solder resist layer. Then, a reflow was conducted at 200° C. to form solder bumps (solder bodies). Accordingly, a multilayer printed wiring board having solder bumps 78 was manufactured (FIG. 18).

In the following, mounting an IC chip on multilayer printed wiring board 10 and further mounting the wiring board on a daughterboard are described.

IC chip 90 is mounted on printed wiring board 10 by means of adhesive 93. Then, connection wires 91 are bonded between pads 92 of IC chip 90 and pads 161 of printed wiring board 10 to connect printed wiring board 10 and IC chip 90. Underfill (UF) is filled to encapsulate IC chip 90 and connection wire 61 of printed wiring board 10 (FIG. 19).

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board comprising:

an insulative board;

a pad formed on a surface of the insulative board and positioned such that the pad is wire-bonded with an electrode of an electronic component;

a conductive circuit contiguous to the pad and formed on the surface of the insulative board;

an insulation layer formed on the insulative board and the conductive circuit, the insulation layer having an opening through which the pad and a portion of the conductive circuit are exposed; and a metal coating formed on the pad, wherein the pad comprises a first portion of a first conductive film formed on the insulative board and a second conductive film formed on the first portion of the first conductive film, the conductive circuit comprises a second portion of the first conductive film contiguously extended from the first portion of the first conductive film underneath the second conductive film of the pad, the first portion and the second portion of the first conductive film and the second conductive film are formed such that the pad having a thickness greater than a thickness of the conductive circuit is formed in the opening of the insulation layer, and the metal coating is formed on a top portion of the pad and on the second portion which is contiguously extended from the first portion of the first conductive film and forms the conductive circuit.

2. The printed wiring board according to claim 1, wherein the pad has a width which is substantially the same as a width of the conductive circuit.

3. The printed wiring board according to claim 1, wherein the thickness of the pad is 2-10 μm greater than the thickness of the conductive circuit.

4. The printed wiring board according to claim 1, wherein the thickness of the pad is less than a thickness of the insulation layer but greater than the thickness of the conductive circuit.

5. The printed wiring board according to claim 1, wherein the metal coating is formed on the top portion and a side portion of the pad.

6. The printed wiring board according to claim 1, wherein the metal coating comprises at least one metal selected from the group consisting of Au, Ni, Pd, Pt, Pb, Ag, Sn and Zn.

7. The printed wiring board according to claim 1, wherein the first conductive film and the second conductive film each comprise an electrolytic copper-plated film.

* * * * *